United States Patent [19]

Samuelsson et al.

[11] 4,328,584
[45] May 4, 1982

[54] METHOD AND ARRANGEMENT FOR SUPERVISING SIGNAL AMPLITUDE CONVERTERS

[75] Inventors: Kurt A. Samuelsson, Tyresö; Walter H. E. Widl, Bandhagen, both of Sweden

[73] Assignee: Telefonaktiebolaget L M Ericsson, Stockholm, Sweden

[21] Appl. No.: 129,636

[22] Filed: Mar. 12, 1980

[30] Foreign Application Priority Data

Mar. 30, 1979 [SE] Sweden ............................ 7902834

[51] Int. Cl.$^3$ .............................................. G06F 11/00
[52] U.S. Cl. ......................................... 371/68; 371/71
[58] Field of Search ............................ 371/68, 8, 71

[56] References Cited

U.S. PATENT DOCUMENTS

| | | | |
|---|---|---|---|
| 3,476,922 | 11/1969 | Yiotis | 371/68 |
| 3,581,075 | 5/1971 | Mattsson et al. | 371/71 |
| 3,686,493 | 8/1972 | Schmid | 371/68 |
| 3,720,819 | 3/1973 | Newton et al. | 371/68 |
| 4,081,790 | 3/1978 | Yamamoto et al. | 371/68 |

Primary Examiner—Charles E. Atkinson

Attorney, Agent, or Firm—Hane, Roberts, Spiecens & Cohen

[57] ABSTRACT

A number of amplitude converters (1) in a telecommunication system are supervised during the normal operation of the system by means of three comparison arrangements (4, 6, 9). The first and the second of the comparison arrangements has its inputs (5 and 7) connected to the inputs and the outputs, respectively, of two of the converters. The third comparison arrangement (9) has its inputs (8) connected to the outputs of the first and the second comparison arrangement and generates an alarm signal if the first comparison arrangement (4) signals a relation between two supervised in-signals, which deviates acceptably from a comparison result set value, and if the second comparison arrangement (6) signals a relation between the two out-signals which deviates unacceptably from a set value. The maximally accepted deviation from the set value of the second comparison arrangement is chosen taken into account the operation tolerance limits of the converters and to the maximally accepted deviation of the first comparison arrangement which is determined so that a smooth supervision is obtained.

9 Claims, 1 Drawing Figure

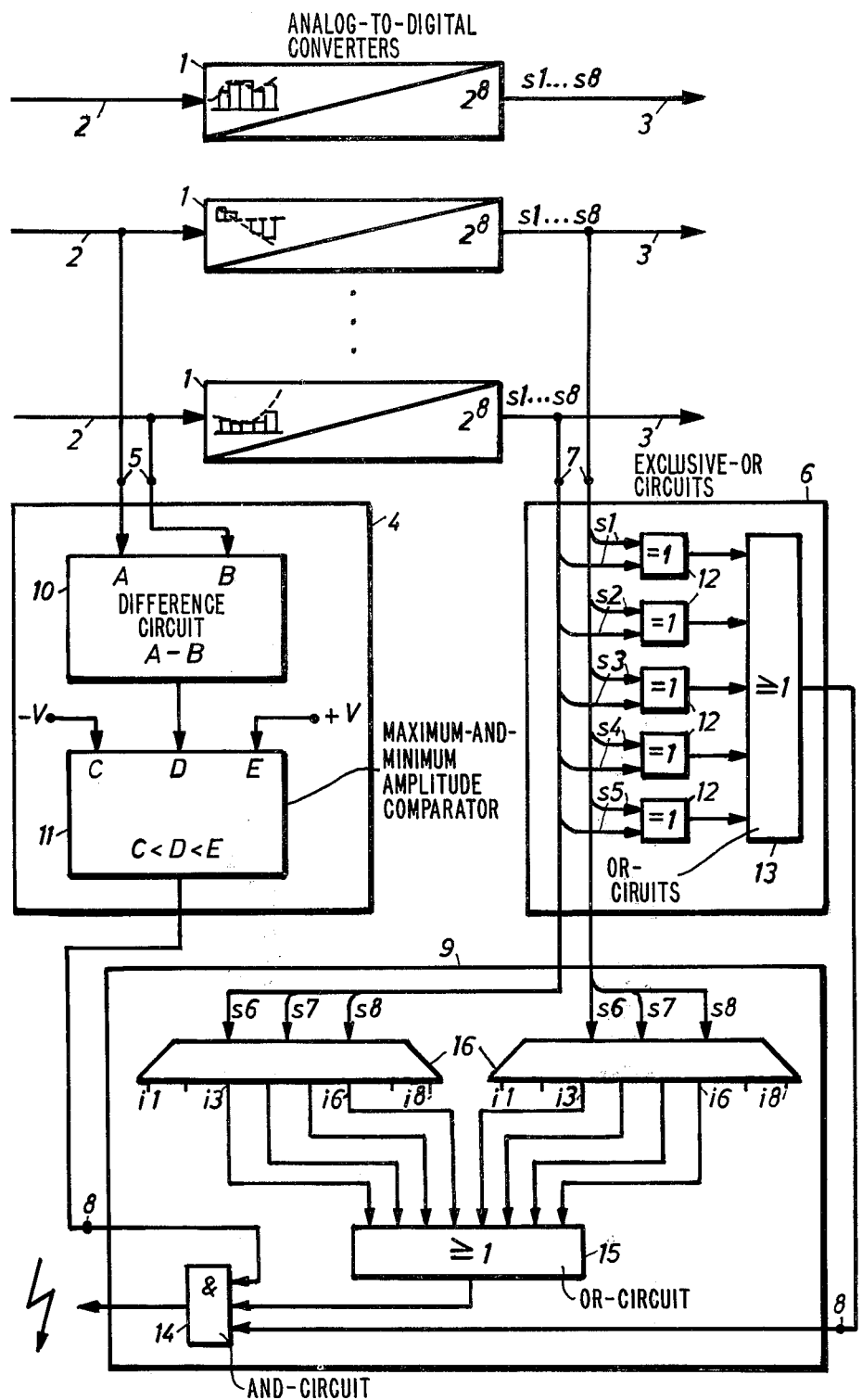

METHOD AND ARRANGEMENT FOR SUPERVISING SIGNAL AMPLITUDE CONVERTERS

FIELD OF THE INVENTION

The present invention refers to a method and an arrangement for supervising a number of signal amplitude converters belonging to one and the same exchange in a telecommunication system during the normal operation of the system, the converters performing within acceptable tolerance limits similar functions based on a continuous converting characteristic, to generate in/out-signal pairs, the out-signals being determined by the associated in-signals and the converting characteristic. The data "signal amplitude converter with continuous converting characteristic" in this connection includes for example conventional analog-digital (A/D)-converters, digital-analog (D/A)-converters, code converters or digital compandors or expandors. The supervision method described below, according to which signal pairs are used which are generated during the normal operation of the telecommunication system, differs in principle from known methods according to which the converters in question—for example encoders/decoders or for example an encoder and a decoder which are arranged in one or two of the exchanges of the system—are released from the normal operation and supervised by means of suitable test signals. The main difference is that the signal converting capacity of the system is reduced owing to the conversion of the test signals while a supervision during normal operation does not influence said capacity.

DESCRIPTION OF PRIOR ART

According to another known method a first of the converters is supervised by means of signal pairs generated during normal operation, but a second converter of the same kind arranged in the same exchange is released from the normal operating and the inputs of the two converters are interconnected and a comparison operation between the generated outsignals is performed. However, the release of the second converter also results in a reduction of the signal converting capacity of the system. The known loop formation between an encoder and a corresponding decoder arranged in the same exchange is also related to this kind of supervision method, because one of the converters is released from the normal operation to be able to compare between signals taken from the loop ends.

In order to maintain the converting capacity of the system it is furthermore known to supervise a converter during normal operation by means of a parallel or loop connection of an extra calibrated test converter which otherwise never takes part in the operation of the system. Furthermore it is known to supervise an encoder in a first exchange and a decoder connected to it for the normal operation in a second exchange by means of an extra connection between the exchanges, which is made of an analog transmission line if the system for the normal operation is provided with digital transmission lines.

SUMMARY OF THE INVENTION

It is an object of the present invention is to achieve good supervision of the signal amplitude converters of the system and to maintain the conversion capacity of the system without using calibrated test converters or extra connections between the exchanges. The proposed solution, characterized in the appended claims, requires a minimal investment of hardware and includes two comparison means connected to two amplitude converters, outputs of these comparison means are connected to a third comparison means for generating an alarm signal if a fault arises in one of the two converters. To find the faulty converter without further hardware investment it is only necessary to exchange one of the two converters connected to the comparison arrangements for a faultfree third one of the converters of the system.

BRIEF DESCRIPTION OF THE DRAWING

The invention will be described more in detail with reference to the accompanying drawing, the only FIGURE of which shows a number of A/D converters included in a telecommunication system, two converters of which are supervised by means of connecting their inputs and outputs to the inputs of three comparison means of which two have their outputs connected to further inputs of the third comparison arrangement on the output of which an alarm signal is generated when a fault arises in one of the converters.

PREFERRED EMBODIMENTS

The drawing shows a number of signal amplitude converters 1 of the same kind belonging to a telecomunication system. On the input lines 2 and the output lines 3 of the converters incoming and outgoing discreetely represented signal amplitudes are transferred, for example analog voltage samples or digitally coded samples. At each conversion operation performed during a conversion period an in/out-signal pair is received and emitted with a phase displacement corresponding to the conversion period, the out-signal being a function of the in-signal. The conversion function may comprise an analog-analog, digital-digital, analog-digital or digital-analog, and a linear, continuously companding or expanding conventional discreet characteristic. This means that, for example, analog-digital ciphering arrangements with a discontinuous conversion characteristic are eliminated. As will be explained the proposed supervision method pays attention to tolerances, which in practice must be allowed both in the converters and in the comparison arrangements utilized for the supervision, and is therefore unsuitable for discontinuous conversion functions.

In the sole FIGURE the converters 1 are shown as conventional A/D-converters. Consequently the in-signals constitute amplitude pulse modulated samples and the out-signals, for example 8-bits PCM words which the converter emits in parallel form. The output lines 3 are therefore 8 wire cables with a wire for each signal bit. The wires are provided with the reference characters s1, s2 ... s8, which simultaneously indicate respective bit significance. On the wire s1 the most significant signal bit is transmitted, on the wire s2 the next-most significant and so on. When there are signal amplitude conversions according to standardized so called "A-Law" or "$\mu$-Law" characteristic, the 4 most significant signal bits define one of 16 characteristic segments further. Each segment comprises 16 intervals which are defined by means of the 4 least significant bits. However, as will become apparent the disclosed system uses a modified characteristic of the five most significant signal bits representing 32 half-segments and three least significant bits representing 8 intervals in a segment The converters are supervised, during normal operation, by means of a supervision arrangement comprising three comparison arrangements.

The first comparison arrangement 4 of the supervision arrangement has its inputs 5 connected to two of the input lines 2 and performs a first comparison operation between the in-signal associated with a first signal pair which is obtained by means of the converter connected to one of the two input lines, and between the in-signal associated with a second signal pair which is obtained by means of the converter connected to the second of such two input lines. The second comparison arrangement 6 performs a second comparison operation between the out-signals associated with these first and second signal pairs, and consequently has its inputs 7 connected to respective output lines. Two inputs 8 of the third comparison arrangement 9 are connected to the outputs of the other two comparison arrangements. The third comparison arrangement performs a third comparison operation between the results of the first and the second comparison operation, and generates an alarm signal if the divergence exceeds the tolerance limits of the converters and the supervision arrangement.

In principle it is possible to perform the proposed supervision by means of arbitrary signal pairs if the supervision arrangement includes memories to store respective in- and out-signals. Such intermediate memories are completely avoided by processing only signals appearing simultaneously. Furthermore it is in principle possible to perform the first and the second comparison operation either by means of difference formations or quotient formations. If arbitrary signal amplitudes are processed, arbitrary difference or quotient results are obtained the similarity of which are supervised by means of the third comparison operation. In this case the quotient formation is preferred to the difference formation because the third comparison operation is simpler to perform between dimensionless quotients than between difference values which, for example, due to the first and the second comparison operation constitute an analogue voltage value and a digital difference word, respectively. The advantage with quotient formation, however, has no importance if only signal amplitudes equal to each other within acceptable tolerance limits are selected by means of the first comparison operation, the difference formations giving result set values ZERO and quotient formations giving result set values ONE.

In the shown embodiment the first comparison arrangement 4 is a conventional analog differend circuit 10 which deals with signal samples received simultaneously and on the output of which analog difference values are obtained, and a conventional analog comparator 11 connected to it, the threshold value inputs of which receive analog threshold voltages $+V$ and $-V$. On the output of the comparator, the result of the first comparison operation is obtained as a first logical signal, a binary "1" indicating an acceptable deviation $<|V|$ and a binary "0" indicating an unacceptable deviation $>|V|$ from the result set value ZERO. The threshold absolute value $|V|$ is chosen so that on the one hand the supervision exactitude is satisfactory and on the other hand so that acceptable deviations occur sufficiently often to achieve an even supervision.

The above described comparison principle, according to which a signal difference is compared with a threshold value, can be utilized for analogue or digital signal samples. Such a comparison arrangement which receives digital samples comprises a conventional digital subtraction circuit and a conventional digital comparator to compare digital sample differenes with digital threshold values. In order to take into account the allowed operation tolerances of the signal amplitude converters, the threshold absolute value for the second comparison operation is chosen in corresponding degree higher than the one for the first comparison operation.

However, the drawing shows another embodiment for the second comparison arrangement 6 to compare digital out-signals received simultaneously. By means of exclusive-OR-gates or circuit 12 having their inputs connected to the output wires s1 ... s5 of the two supervised converters and their outputs connected to a first OR-gate or circuit 13, the bits with the same significance of the out-signals are compared to each other. A binary "0", emitted from the output of the first OR-gate, indicates that the out-signals belong to the same half segment defined by means of the 5 most significant signal bits. A binary "1" on this output indicates that the out-signals of the supervised converters belong to different half segments.

If, as above assumed, a binary "1" obtained at the first comparison operation by comparison arrangement 4 and a binary "0" obtained at the second comparison operation by comparison arrangement 6 indicate acceptable signal pair differences, the third comparison arrangement 9 is easiest implemented by means of an AND-gate or circuit which only due to a received binary "1—1"-combination generates an alarm signal. However, this does not take into account that there can be a conversion fault if the difference is unacceptable between the in-signals but acceptable beteen the out-signals ("0—0"-combination). If indeed there is a fault this is nevertheless discovered sufficiently fast by means of acceptable in-signals.

If, on the other hand, the second comparison arrangement 6 comprises the exclusive-OR-gates 12 shown in the drawing, the mentioned "1—1"-combination indicating a conversion fault can be obtained when there is actually no fault, if one of the analog in-signals corresponds to the highest amplitude within a half segment while the another analog in-signal corresponds to the lowest amplitude within the adjacent half segment. Such a false alarm is avoided by providing the AND-gate 14 of the third comparison arrangement 9, which has two inputs connected to the outputs of the analog comparator 11 and the first OR-gate 13, with a third input which is connected to a second OR-gate 15. The third comparison arrangement 9 shown in the drawing furthermore comprises two decoders 16, each having their inputs connected to the output wires s6, s7 and s8 of one of the supervised converters. The outputs i1 ... i8 of the decoders each represents an interval in the half segment determined by the most significant signal bits s1 ... s5. Only the outputs i3, i4, i5, and i6 of the decoders, representing the four middle-intervals of the half segment, are connected to the inputs of the second OR-gate or circuit 15, the output of which consequently is activated if at least one of the converters emits such an middle-interval-sample. If the AND-gate or circuit 14 receives a binary "1" from the analog convertor 11 due to acceptable in-signal difference, receives a binary "1" from the second OR-gate 15 as an indication that the just processed signal pairs refer to one of such signal pairs which are chosen for supervision and which are represented by said middle-intervals, and receives a binary "1" from the first OR-gate 13 due to unacceptable half segment divergence, one of the supervised converters is faulty and the AND-gate 14 generates the alarm signal. The difference of the out-signals is in that way acceptable if the digital samples correspond to a middle-interval and a limit-interval within the same half segment. By that, the operation tolerances of the converters have been taken care of, because said analog threshold voltages ±V can be chosen in such a way that a smaller difference is required from the in-signals than from the out-signals.

For clearness the drawing does not show the clock control of the system, by means of which the converters obtain synchronous in-signals and emit synchronous out-signals. The drawing does not show delay circuits either, which are necessary when there is a phase difference between the result signals of the first and second comparison operation, which phase difference originates from different operation times on one hand in the first comparison arrangement and on the other hand in the converters and the second comparison arrangement.

What we claim is:

1. In a system wherein signals are processed by a signal converters, the method of supervising the operation of at least two signal converters, one of said signal converters converting a first input-signal to a first output-signal, the other of said signal converters converting a second input-signal to a second output-signal, said method comprising the steps of giving a first indication of whether or not the relationship between the first and second input-signals satisfies a first given criterion, giving a second indication of whether or not the relationship between the first and second output signals satisfies a second given criterion related to the first criterion and the conversion processes performed by the signal converters, and giving an alarm only when the first indication is given and the second indication is not given.

2. The method of claim 1 wherein such method is performed by signal amplitude converters in the exchange of a telecommunications system wherein the converters have a continuous conversion characteristic which defines the relationship between an input signal and its related output signal.

3. The method of claim 2 wherein the giving the first indication step includes amplitude comparing the first and second input signals and wherein the giving the second indication step includes amplitude comparing the first and second output signals.

4. The method of claim 3 wherein the comparing of the first and second input signals comprises an amplitude difference operation and said first indication is given only when the difference signal exceeds a first given absolute value.

5. The method of claim 3 wherein said input signals are pulse-sampled analog signals and said difference operation comprises an analog subtraction of the first and second input signals and a comparing of the absolute value of amplitude of the difference signal with a given absolute value; and wherein the first and second output signals are first and second digital values representing the analog amplitudes of the input signals, and the giving of the second indication step includes comparing the first and second digital values and giving an indication if the difference between the first and second digital values exceeds a given digital value.

6. The method of claim 1 wherein a plurality of signals are processed in parallel by a plurality of signal converters further comprising the step of selecting two of the signal converters for supervision.

7. In a system wherein a plurality of signals are processed in parallel by a plurality of signal converters, apparatus for supervising the operation of at least two signal converters, one of said signal converters converting a first input signal of the plurality to a first output signal, the other of said signal converters converting a second input signal of the plurality to a second output signal, said apparatus comprising first logical means for giving a first indication of whether or not the relationship between the first and second input signals satisfies a first given criterion, second logical means for giving a second indication of whether or not the relationship between the first and second output signals satisfies a second given criterion related to the first criterion and the conversion processes performed by the signal converters, and third logical means giving an alarm only when the first indication is given and the second indication is not given.

8. The apparatus of claim 7 wherein said first logical means comprises a first threshold means for giving a first or second binary indication indicating whether the difference in the input signals is within or without a given range, respectively, and said second logical means comprises a second threshold means for giving said first or said second binary indicator indicating whether the difference in output signals is within or without a given range, respectively, and wherein said third logical means includes means for giving an alarm only when said first binary indication is given by said first logical means and said second binary indication is not given by said second logical means.

9. The apparatus of claim 8 wherein said differences in the signals are amplitude differences and said threshold means include difference forming means related to the amplitudes of the signals.

* * * * *